United States Patent
Randolph et al.

[11] Patent Number: 5,959,937
[45] Date of Patent: Sep. 28, 1999

[54] DUAL CLOCKING SCHEME IN A MULTI-PORT RAM

[75] Inventors: William L. Randolph, Durham; Rhonda Cassada, Hillsborough, both of N.C.; Tim Lao, San Jose, Calif.

[73] Assignee: Mitsubishi Semiconductor America, Inc., Durham, N.C.

[21] Appl. No.: 09/024,559

[22] Filed: Feb. 17, 1998

Related U.S. Application Data

[60] Provisional application No. 60/040,053, Mar. 7, 1997.

[51] Int. Cl.$^6$ ........................................ G11C 8/00
[52] U.S. Cl. .............. 365/233; 365/230.05; 365/189.05; 365/230.08
[58] Field of Search ............... 365/233, 230.05, 365/189.04, 189.05, 230.08

[56] References Cited

U.S. PATENT DOCUMENTS 5,566,318  10/1996  Joseph .
5,812,490  9/1998  Tsukude ................. 365/189.05 X
5,815,462  9/1998  Konishi et al. ................. 365/233

*Primary Examiner*—Huan Hoang
*Attorney, Agent, or Firm*—McDermott, Will & Emery

[57] ABSTRACT

A multi-port memory chip is provided with a DRAM main memory and a SRAM cache memory coupled via a global bus. Two clock pins are arranged on the opposite sides of the chip to supply external clock signals. Input clock buffers are provided near pads associated with the clock pins to produce buffered clock signals. A clock generator arranged on the chip uses the buffered clock signals to generate an internal clock signal for synchronizing memory operations. Four local clock buffers distributed on the memory chip are supplied with the buffered clock signals to produce local clock signals for synchronizing data output from data pins.

12 Claims, 2 Drawing Sheets

DUAL CLOCKING SCHEME IN A MULTI-PORT RAM

This application claims the benefit of U.S. Provisional Application No. 60/040,053 filed Mar. 7, 1997.

TECHNICAL FIELD

This application relates to memory devices, and in particular, to a multi-port random access memory (MPRAM) that produces multiple internal clock signals based on two external clock signals.

BACKGROUND ART

The development of a computer graphics system creates the need for fast memories capable of storing huge amounts of data, such as 3-D graphics data. Among such memories are cached memories developed to improve DRAM main memory performance by utilizing a faster SRAM cache memory for storing the most commonly accessed data. For example, U.S. Pat. No. 5,566,318 discloses an enhanced DRAM that integrates a SRAM cache memory with a DRAM on a single chip. Sense amplifiers and column write select registers are coupled between the SRAM cache and the DRAM memory array. A column decoder is associated with the SRAM cache for providing access to the desired column of the SRAM. A row decoder is associated with the DRAM memory array to enable access to particular rows of the DRAM. Input/output control and data latches receive data from the SRAM to provide data output via data input/output lines. The current row of data being accessed from the DRAM memory array is held in the SRAM cache memory. Should a cache "miss" be detected, the entire cache memory is refilled from the DRAM memory array over a DRAM-to-cache memory bus.

As a way of improving speed and performance of a RAM, a dual-port RAM has been developed which enables two separate input/output ports to access the memory array. However, the dual-port RAM cannot provide effective control of data input and output, because its ports are not interchangeable. For example, data traffic cannot be redistributed between the ports, when one of them is overloaded and the other is underloaded.

Accordingly, it would be desirable to provide a multi-port RAM (MPRAM) chip having interchangeable input/output data ports.

In a synchronous memory, all operations may be referenced to the rising edge of the internal clock. At high frequencies, the internal clock must be controlled very accurately because the time from a rising edge of the internal clock to the next rising edge becomes very short. Therefore, any shift or skew in the internal clock would cause the memory to operate incorrectly.

This is especially important for output of data from an MPRAM. The output data may be driven out of the MPRAM to an external controller at the rising edge of the internal clock. At high clock frequencies, any skew in the internal clock rising edge will delay the output of data to the external controller. As the controller has a set time window during which it can accept data from the memory, the delay in data output will cause the controller to miss the output data. Therefore, the external controller must reduce the clock frequency to allow the output data to be within the set data window. This reduction would limit the speed and performance of the MPRAM.

Moreover, different groups of data pins may be required to be on opposite corners of a memory chip. In this case, the internal clock driving one group of data pins will be skewed with respect to the internal clock driving the data pins located on the opposite corner. To compensate for data output shift caused by the skewed clocks operating frequency of the memory should be reduced. As a result, the performance of the memory would deteriorate.

The skew of internal clocks within an MPRAM chip depends on gate and parasitic loading of physical clock lines carrying the internal clock signals. The gate loading of a line corresponds to the number of logic elements connected to the lines. Parasitic resistance and capacitance of a line determine its parasitic loading.

Thus, it would be desirable to provide an MPRAM with a clocking scheme that allows the loading of physical clock lines to be decreased, to reduce the skew of internal clocks.

DISCLOSURE OF THE INVENTION

Accordingly, one advantage of the invention is in providing a multi-port memory chip having interchangeable data ports.

Another advantage of the invention is in providing an MPRAM chip having a clocking scheme that allows the loading of physical clock lines within the chip to be decreased, to reduce the skew of internal clocks driving data ports.

The above and other advantages of the present invention are achieved, at least in part, by providing a memory chip having multiple data pins for input and output of data. First and second clock pins are arranged on the chip for supplying first and second external clock signals. First and second input clock buffers are respectively coupled to the first and second clock pins for producing first and second buffered clock signals. Based on these signals, an internal clock generator produces an internal clock signal for synchronizing operations of the memory device. Further, multiple local clock buffers arranged on the chip use the first and second buffered clock signals for producing multiple local clock signals for synchronizing data output from the data pins.

In accordance with one aspect of the invention, the data pins may comprise first and second groups of pins arranged on opposite sides of the chip. The local clock signals may comprise first and second sets of clock signals for driving data output from the first and second groups of pins, respectively. The first set of clock signals is based on the first buffered clock signal, whereas the second set of clock signals is based on the second buffered clock signal.

In accordance with another aspect of the invention, the first set of clock signals may comprise first and second subsets of clock signals for driving data pins arranged near first and second corners of the chip, respectively. The second set of clock signals comprises third and fourth subsets of clock signals for driving data pins arranged near third and fourth corners of the chip. The local clock buffers may comprise first, second, third and fourth local clock buffers for respectively producing the first, second, third and fourth subsets of clock signals.

In accordance with a method of the present invention, the following steps are carried out for providing synchronization of a memory chip:

supplying first and second external clock signals to first and second clock pins arranged on opposite sides of the memory chip, buffering the first and second external clock signals by first and second input clock buffers, respectively, to produce first and second buffered clock signals, supplying the first and second buffered clock signals to a clock generator to generate an internal clock signal for synchronizing memory chip operations, supplying the first buffered clock signals to a first group of local clock buffers to produce a first set of local clock signals for synchronizing data output from a first group of data pins, and supplying the second buffered clock signals to a second group of local clock buffers to produce a second set of local clock signals for synchronizing data output from a second group of data pins.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
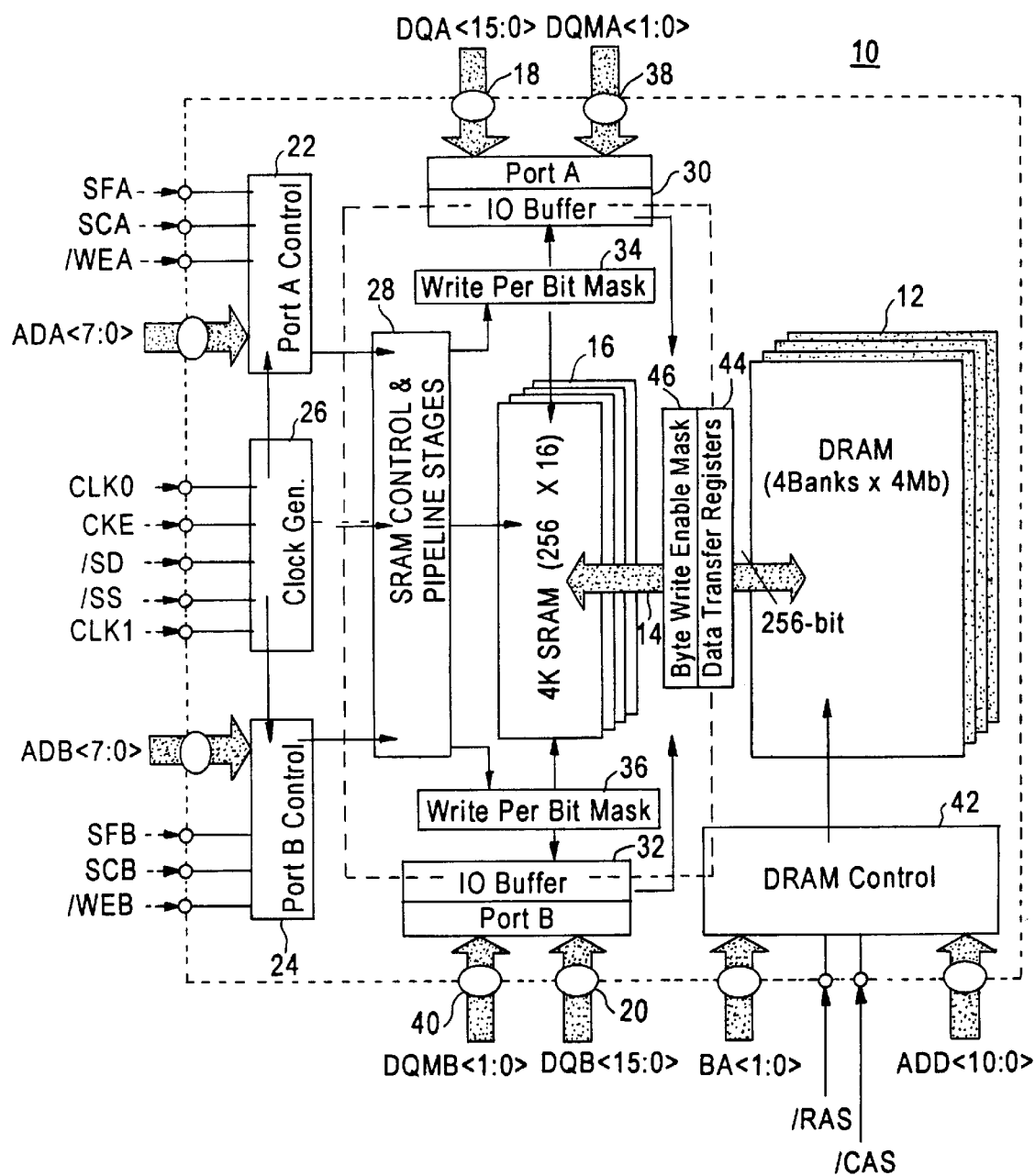
FIG. 1 is a block diagram illustrating architecture of a multi-port RAM chip of the present invention.

Although the invention has general applicability in the field of memory devices, the best mode for practicing the invention is based in part on the realization of a multi-port RAM (MPRAM) 10 illustrated in FIG. 1. The MPRAM 10 arranged on a single chip comprises a DRAM 12 divided into four independently addressable memory banks of 4Mbits each. Each bank contains a memory array organized as 512 rows by 32 columns by 256 bits. A single 256-bit global input-output (IO) bus 14 is shared by all 4 banks of the DRAM 12, and connects the DRAM 12 to a SRAM 16.

The 4-kbit SRAM 16 may be organized as 16 lines by 16 words by 16 bits. Each 256-bit transfer between the DRAM 12 and the SRAM 16 replaces or updates one of 16 lines in the SRAM 16.

The MPRAM 10 has two identical and independent 16-bit IO ports A and B. Each of the ports A and B provides read and write accesses to each cell of the SRAM 16. IO data pins 18 and 20 are respectively connected to the ports A and B for providing input and output of 16-bit data DQA and DQB. An external 16-bit IO bus may be connected to each of the data pins 18 and 20 for writing and reading data to and from the MPRAM 10.

SRAM control signals SCA and SCB for the ports A and B, respectively, are supplied via a port A control circuit 22 and a port B control circuit 24 to define SRAM operations such as data read or write, and burst termination. Write enable commands /WEA and /WEB for the ports A and B are provided via the port control circuits 22 and 24, respectively, to decode SRAM write operations. Also, the port control circuits 22 and 24 may receive special function commands SFA and SFB, respectively, for enabling a write per bit mode of operation, and to provide burst termination.

As discussed in more detail later, two external clock signals CLK0 and CLK1 have the same frequency and phase are used to control MPRAM operations. A clock generator 26 supplied with the clock signals CLK0 and CLK1 provides an internal clock for MPRAM operations. A master clock enable signal CKE is fed into the clock generator 26 to enable the internal clock generation. Chip select signals /SD and /SS provide chip select functions for the DRAM 12 and the SRAM 16, respectively.

The port control circuits 22 and 24, and the clock generator 26 are coupled to a SRAM control circuit 28 that controls write and read accesses to the SRAM 16. The data transfer path between each of the IO data pins 18 and 20 and the SRAM 16 for data writing or reading is arranged as a two-stage pipeline.

To write data into the SRAM 16, write commands WA and WB for ports A and B, respectively, may be issued by the SRAM control circuit 28 on the first clock cycle, and the data to be written is supplied on the second clock cycle. The addressed line and word of the SRAM 16 is determined by 8-bit address signals ADA and ADB for ports A and B, respectively, supplied to the port control circuits 22 and 24. For example, the addressed line may be defined by four high-order bits of the address signals ADA and ADB, and the addressed 16-bit word may be determined by four low-order bits of the address signals ADA and ADB.

For reading data from the SRAM 16, read commands RA and RB may be issued by the SRAM control circuit 28 on the first clock cycle, the data is accessed at the second clock's rising edge, and the data is made valid on the third clock cycle. Similarly to writing operations, the addressed line and word of the SRAM 16 is determined by the address signals ADA and ADB for ports A and B, respectively. For example, the addressed line may be defined by four high order bits of the address signals ADA and ADB, and the addressed 16-bit word may be determined by four low-order bits of the address signals ADA and ADB.

Ports A and B are independent and may simultaneously provide reading and writing data from or to any location in the SRAM 16. However, the user is prevented from writing to the same SRAM cell from both ports simultaneously. IO buffers 30 and 32 are coupled to the ports A and B, respectively, to buffer data during read and write operations.

Write per bit mask registers 34 and 36 connected to the IO buffers 30 and 32, respectively, are used to perform masked write operations from ports A and B. The SRAM control circuits issue masked write commands MWA and MWB for ports A and B, respectively, to mask the DQA and DQB data being read from the SRAM 16 or written into the SRAM 16. Pins 38 and 40 supply two-bit mask control data DQMA and DQMB for ports A and B, respectively. When either bit of the mask control data DQMA and DQMB is set high, the DQA and DQB data, respectively, being read or written is masked. For example, the high-order bit of the mask control data DQMA and DQMB respectively controls the upper byte of the DQA and DQB data. The low-order bit of the mask control data DQMA and DQMB may respectively control the lower byte of the DQA and DQB data. Load mask register commands LMRA and LMRB may be issued by the SRAM control circuit 28 for ports A and B, respectively, to load the write per bit registers 34 and 36.

The MPRAM 10 allows the SRAM 16 and DRAM 12 to operate concurrently. A DRAM control circuit 42 forms DRAM control commands defined by control signals /RAS and /CAS. A 2-bit bank address command BA selects one of four DRAM banks. An 11-bit address command ADD selects DRAM row and column addresses, DRAM transfer operations and lines in the SRAM 16 from which data may be transferred to the DRAM 12 or to which data may be transferred from the DRAM 12. For example, nine low-order bits of the ADD command may select DRAM row address, five low-order bits may select DRAM column address, two bits of the ADD command may be used to define DRAM transfer operations, and four high-order bits may select one of sixteen lines in the SRAM.

The DRAM control circuit 42 forms a DRAM read transfer command DRT to transfer 1 of 32 blocks of data indicated by the ADD command into 1 of 16 lines in the SRAM 16. A DRAM write transfer command DWT is formed by the DRAM control circuit 42 to transfer data from 1 of 16 SRAM lines indicated by the ADD command to 1 of 32 blocks in the DRAM 12.

Data transfer registers 44 are arranged between the DRAM 12 and SRAM 16 to support data transfer between the DRAM 12 and SRAM 16. A 32-bit byte write enable mask register 46 is used to mask DRAM write transfers. The register 46 may be loaded from either port A or port B when the load mask register command LMR is issued. Each bit in the register 46 masks a byte of the 256-bit global IO bus 14. The byte write enable mask register 46 and write per bit mask registers 34 and 36 may be bypassed during writes to the DRAM 12 and SRAM 16, respectively. Data transfers between the SRAM 16 and the DRAM 12 via the global IO bus 16 are disclosed in more detail in our copending application Ser. No. 08/937,004, entitled "MULTI-PORT RAM HAVING SHARED GLOBAL BUS" filed on Sep. 24, 1997 and incorporated herewith by reference.

The MPRAM 10 has a programmable burst mode that allows the user to select burst lengths of 1, 2, 4 and 8 for bursts of data being written from the ports A and B to the SRAM 16 or bursts of data being read from the SRAM 16 to the ports A and B. Sequential or interleave bursts may be selected. A set mode register command SMR issued by the DRAM control circuit 42 enables the burst length and type to be programmed in an internal mode register. A mode register code (MRC) to be programmed in the mode register may be entered using the ADD command. The MRC is stored in the mode register until it is overwritten by the next SMR command, or until power is no longer supplied to the MPRAM 10. The SMR command may be issued when the DRAM 12 and SRAM 16 are in an idle state. Burst terminate commands BTA and BTB may be issued by the SRAM control circuit 28 to terminate burst sequences from or to the ports A and B, respectively.

Figure 2:
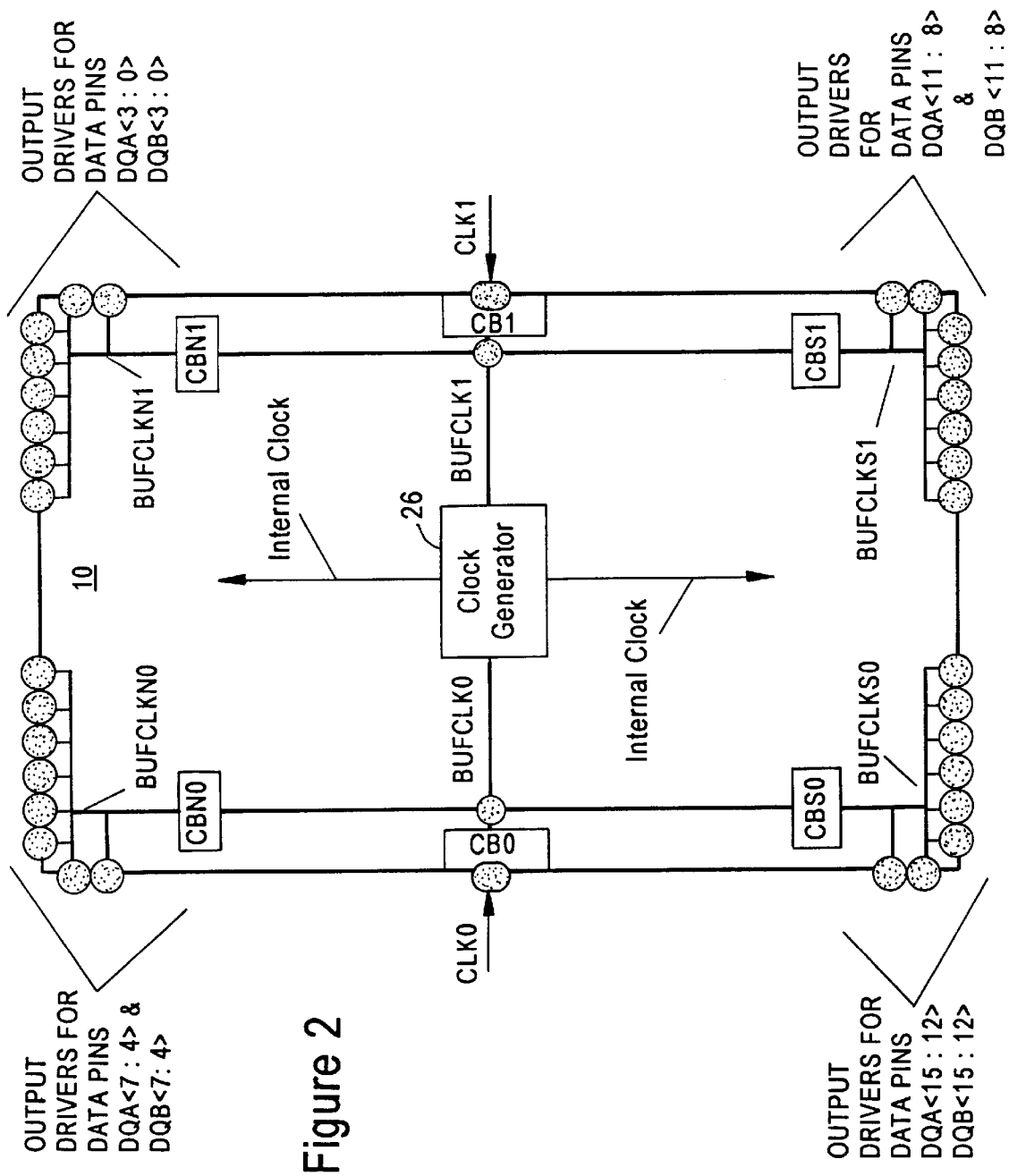
FIG. 2 is a block-diagram schematically illustrating a dual-clocking arrangement in accordance with the present invention.

As described above, two external clock signals CLK0 and CLK1 having the same frequency and phase are supplied to the MPRAM chip 10. Referring to FIG. 2, two clock pins CLK0 and CLK1 for receiving the corresponding clock signals CLK0 and CLK1 are arranged on opposite sides of the MPRAM chip 10. For example, the clock pin CLK0 may be provided on the West side of the chip 10 shown in FIG. 2, whereas the clock pin CLK1 may be located on the East side of the chip 10.

Each of the clocks CLK0 and CLK1 are buffered near the corresponding clock pad. A clock buffer CB0 for buffering the clock CLK0 is arranged near the pad connected with the pin CLK0, whereas a clock buffer CB1 for buffering the clock CLK1 is provided near the pad associated with the pin CLK1. The clock buffers CB0 and CB1 respectively produce buffered clock signals BUFCLK0 and BUFCLK1 having the same frequency and phase as the external clock signals CLK0 and CLK1. For example, a chain of inverters may be used to implement each of the clock buffers CB0 and CB1.

The clock signals BUFCLK0 and BUFCLK1 are supplied to the clock generator 26 controlled by the clock enable signal CKE to produce an internal clock signal at a frequency of the external clock signals CLK0 and CLK1. The internal clock signal may be supplied to all circuits of the MPRAM, except for output data drivers associated with data pins DQA and DQB.

Further, the clock signal BUFCLK0 is supplied to clock buffers CBN0 and CBS0 to produce buffered clock signals BUFCLKN0 and BUCLKS0 for driving data pins located, for example, on the northwest and southwest corners of the chip 10. The clock signal BUFCLK1 is provided to clock buffers CBN1 and CBS1 to produce buffered clock signals BUFCLKN1 and BUFCLKS1 for driving data pins arranged, for example, on the northeast and southeast corners of the chip. The local clock signals BUFCLKN0, BUFCLKS0, BUFCLKN1 and BUBCLKS1 are produced at the same frequency and phase as the clock signals BUFCLK0 and BUFCLK1. For example, a chain of inverters may be used to implement each of the clock buffers CBN0, CBS0, CBN1 and CBS1.

To provide input/output of 16-bit data, each of data ports A and B has 16 data pins DQA<15:0> and DQB<15:0>, respectively, arranged on all four corners of the MPRAM chip 10. To provide interchangeability of ports A and B, the data pins DQA and DQB for carrying a data bit of the same order are grouped together. For example, the data pins DQA<15:12> and DQB<15:12> for carrying the high-order bits of data in ports A and B may be arranged on the southwest corner of the MPRAM chip 10 shown in FIG. 2. The next data pins DQA<11:8> and DQB<11:8> of ports A and B may be provided on the southeast corner of the MPRAM chip 10. The data pins DQA<7:4> and DQB<7:4> may be located on the northwest corner of the chip 10. Finally, the data pins DQA<3:0> and DQB<3:0> for carrying the low-order data bits may be arranged on the northeast corner of the chip 10.

To support data output from the data pins DQA<15:12> and DQB<15:12>, the clock buffer CBSO may be arranged in the vicinity of these data pins. The clock buffer CBNO may be located near the northwest corner of the chip 10 to drive the data pins DQA<7:4> and DQB<7:4>. The clock buffer CBS1 may be provided near the southeast corner of the chip 10 to drive the data pins DQA<11:8> and DQB<11:8>. Finally, the clock buffer CBN1 for driving the low-order data pins DQA<3:0> and DQB<3:0> may be arranged on the northeast corner of the MPRAM chip 10.

The local clock signals BUFCLKS0, BUFCLKN0. BUFCLKS1 and BUFCLKN1 produced by the clock buffers CBS0, CBN0, CBS1 and CBN1 respectively, are supplied to output drivers of the data pins arranged on the corresponding corners of the MPRAM chip 10 to provide synchronization of data output from these pins. In particular, the clock signal BUCLKS0 may be supplied to output drivers of the data pins DQA<15:12> and DQB<15:12> to synchronize output of high-order bits from the data ports A and B. The clock signal BUFCLKS1 may support data output from the data pins DQA<11:8> and DQB<11:8>. The clock signal BUFCLKN0 may be supplied to output drivers for driving data output from the data pins DQA<7:4> and DQB<7:4>. Finally, the clock signal BUFCLKN1 may synchronize output of the low-order data bits from the pins DQA<3:0> and DQB<3:0>.

As four local clock signals are used for driving the data pins, the gate loading and parasitic loading associated with each of the local clock signal are substantially reduced. This results in the reduction of phase and frequency differences between the internal clock signal and the local clock signals for synchronizing data output from the pins DQA and DQB. Thus, the MPRAM 10 is enabled to operate at its maximum frequency.

Also, the loading associated with the buffered clock signals BUFCLK0 and BUFCLK1 is matched. Thus, the small skews between local clock signals on opposite sides of the MPRAM chip are equalized.

There, accordingly, has been described a multi-port memory chip having a DRAM main memory and a SRAM cache memory coupled via a global bus. Two clock pins are arranged on the opposite sides of the chip to supply external clock signals. Input clock buffers are provided near pads associated with the clock pins to produce buffered clock signals. A clock generator arranged on the chip uses the buffered clock signals to generate an internal clock signal for synchronizing memory operations. Four local clock buffers distributed on the memory chip are supplied with the buffered clock signals to produce local clock signals for synchronizing data output from data pins.

In this disclosure, there are shown and described only the preferred embodiments of the invention, but it is to be understood that the invention is capable of changes and modifications within the scope of the inventive concept as expressed herein.

What is claimed is:

1. A multi-port memory device comprising on a single chip:

multiple data pins for input and output of data, first and second clock pins for respectively supplying first and second external clock signals, first and second input clock buffers respectively coupled to said first and second clock pins for producing first and second buffered clock signals, a clock generator responsive to said first and second buffered clock signals for producing an internal clock signal for synchronizing operations of said memory device, and multiple local clock buffers arranged on said chip and responsive to said first and second buffered clock signals for producing multiple local clock signals for synchronizing data output from said data pins.

2. The device of claim 1, wherein said data pins comprise first and second groups of pins arranged on opposite sides of said chip.

3. The device of claim 2, wherein said local clock signals comprise a first set of clock signals for driving data output from said first group of pins.

4. The device of claim 3, wherein said local clock signals further comprise a second set of clock signals for driving data output from said second group of pins.

5. The device of claim 4, wherein said first set of clock signals is based on said first buffered clock signal.

6. The device of claim 5, wherein said second set of clock signals is based on said second buffered clock signal.

7. The device of claim 6, wherein said first set comprises a first subset of clock signals for driving data pins arranged near a first corner of said chip.

8. The device of claim 7, wherein said first set further comprises a second subset of clock signals for driving data pins arranged near a second corner of said chip.

9. The device of claim 8, wherein said second set comprises a third subset of clock signals for driving data pins arranged near a third corner of said chip.

10. The device of claim 9, wherein said second set comprises a fourth subset of clock signals for driving data pins arranged near a fourth corner of said chip.

11. The device of claim 10, wherein said local clock buffers comprise first, second, third and fourth local clock buffers for respectively producing said first, second, third and fourth subsets of clock signals.

12. A method of providing synchronization of a memory chip, comprising the steps of:

supplying first and second external clock signals to first and second clock pins arranged on opposite sides of the memory chip, buffering the first and second external clock signals by first and second input clock buffers, respectively, to produce first and second buffered clock signals, supplying the first and second buffered clock signals to a clock generator to generate an internal clock signal for synchronizing memory chip operations, supplying the first buffered clock signals to a first group of local clock buffers to produce a first set of local clock signals for synchronizing data output from a first group of data pins, and supplying the second buffered clock signals to a second group of local clock buffers to produce a second set of local clock signals for synchronizing data output from a second group of data pins.

* * * * *